United States Patent [19]
Dugan

[11] 3,992,584
[45] Nov. 16, 1976

[54] AUTOMATIC MICROPHONE MIXER

[76] Inventor: Daniel W. Dugan, 1024 Sacramento St., San Francisco, Calif. 94108

[22] Filed: May 9, 1975

[21] Appl. No.: 575,951

[52] U.S. Cl. ............................. 179/1 AT; 325/404; 179/1 VL
[51] Int. Cl.² ......................................... H04M 1/60
[58] Field of Search ................. 179/1 SA, 1 R, 1 A, 179/1 AT, 1 F, 1 FS, 1 CN, 1 P, 1 VC, 1 VL; 330/29, 30, 124 R; 325/316, 303, 305, 404

[56] References Cited
UNITED STATES PATENTS

| | | | |
|---|---|---|---|
| 3,160,707 | 12/1964 | Meyers | 179/1 P |
| 3,296,532 | 1/1967 | Robinson | 325/305 |
| 3,629,718 | 12/1971 | Klein | 330/29 |
| 3,755,625 | 8/1973 | Maston | 179/1 CN |
| 3,814,856 | 6/1974 | Dugan | 179/1 VC |
| 3,893,038 | 7/1975 | Omata | 330/124 R |

Primary Examiner—Kathleen H. Claffy
Assistant Examiner—E. Matt Kemeny
Attorney, Agent, or Firm—Julian Caplan

[57] ABSTRACT

In a sound reinforcement system having a plurality of input channels and input signal sources and at least one output channel, a gain control apparatus is provided for controlling the gain applied to the signals in each channel whereby the total gain of the system remains constant. Gain changes in each channel are proportional to signal ratios such that the automatic gain variations in all channels are always complementary. In a preferred embodiment, the control apparatus comprises means for providing a reference signal having a magnitude proportional to the sum of the amplitudes of the signals in the channels and a plurality of control signals each of which has a magnitude proportional to the amplitude of the signal in a respective one of said channels, and a plurality of attenuating means, each of which is responsive to the ratio of the corresponding one of said control signals to the reference signal.

9 Claims, 3 Drawing Figures

AUTOMATIC MICROPHONE MIXER

BACKGROUND OF THE INVENTION

The present invention relates to signal control systems in general and in particular to a signal control system for controlling the amplitude of signals in a multi-microphone sound reinforcement system.

The dream of an effective voice-operated reinforcement system (VOX) has been pursued by creative sound men ever since the problem was recognized. The stumbling block on which most attempts have failed is the method by which the need for a microphone to be on is detected. Excellent performance has been obtained in systems in which the detection was by means other than acoustical, such as foot mats or push-to-talk switches. Gain control to prevent feedback in these systems has been achieved either through logic which prevents more than a small number of mikes from being open at the same time, a master gain adjustor responsive to the number of open microphones, or a combination of these methods. The general disadvantage these systems share is in the amount of special equipment which must be custom-built for each job.

Voice-operated systems are frequently tried but rarely effective in increasing the gain of a sound system. This is due to the inadequancy of the process used to detect the active microphones, gating with a fixed threshold. VOX devices can be effective in reducing ambient noise pickup in a multi-mike system as long as the noise level is always less than the minimum speech level. This condition does not exist in most meeting rooms. It is impossible to find a satisfactory setting for VOX controls in most applications. If the VOX threshold of a mike channel is set at a low enough level to detect the minimum level signals that occur, such as a weak talker who is a bit off-mike, then any loud sound in the room, such as a strong talker at another mike, music, or applause will turn on the mike. If, to prevent this false triggering, the VOX threshold of an input is set at a high enough level to reject noise and the loudspeaker's sounds, then it will be too insensitive to pick up soft speech. The audible effect will be irritating, intermittent speech under marginal conditions.

The performance of VOX devices can be optimized by making their control circuits frequency discriminatory. The gate can be made to trigger more readily on signals with a typical speech spectrum, which makes the unit less sensitive to ambient noise. This type of improvement is not sufficient to give increased gain in a sound reinforcement system. It is always possible for some sound to turn on a number of mikes or all mikes. The resulting feedback howl will keep all the VOX's open.

Experimental and practical systems have been built in which either VOX or manual gating of the input channels is used, and an automatic attenuator reduces the master gain in accordance with the number of inputs activated at any time. Such an automatic control function looks like this:

| NOM | Master gain adjustment dB |
| --- | --- |
| 1 | 0 |
| 2 | −3 |
| 3 | −4.8 |
| 4 | −6.0 |
| 5 | −7.0 |
| * | * |
| 10 | −10.0 |
| * | * |
| 20 | −13.0 |
| * | * |
| 100 | −20.0 | where NOM is the Number of Open Microphones. A system with such an automatic attenuator will provide the maximum possible gain for the number of mikes on at any time. The runaway feedback condition, in which the feedback keeps the VOX's open, will not occur. If an automatic master gain control of this type were combined with a voice-operated gate which worked well, a fully automatic mixing system could be created.

The solution to th problem of accurately detecting when a microphone chanel should be gated on lies in the use of an adaptive threshold for the input chanel gates. If the thresholds of the VOX gates are continuously adjusted to follow the ambient sould level conditions, then individual channels will open only when their signals exceed the ambient sound level. The criterion for a mike being on becomes the signal-to-noise ratio at the mike, rather than the sould level. This little-known technique has been applied to special communication systems but, so far as is known, has not heretofore been applied to sound reinforcement. Unfortunately, the conventional VOX gate cannot tell the difference between sounds which originate near the mike and far away; it acts only on the level of the signal.

If a source of sound is beyond the critical distance from the microphone or below the ambient noise level, it is not possible to amplify it in a reinforcement system. Experienced mixers know that if a microphone's gain is raised trying to reach for a source of sound which is too far away or lost in the noise, the result will be feedback or mush. Conversely, the sound system is better off for both noise and gain whenever mikes which aren't picking up anything useful are turned down. The adaptive threshold gating technique makes its decision on just the right criterion: is the mike hearing anything special besides the general sound in the room?

Experiments in the field have confirmed that the adaptive threshold gate is an extraordinarily accurate and reliable indicator of the need for the microphone to be on in both speech and music systems. A system embodying this principle was prototyped, and is described in applicant's U.S. Pat. No. 3,814,856.

As described in U.S. Pat. No. 3,814,856, the most straightforward way to obtain an ambient noise threshold is to monitor the sound level in the area with a microphone. In the patent there is described a mixing system applying the combination of adaptive threshold gating with number-of-open-microphones gain adjustment. Only a limited number of input channels are shown. The signal path to the output is identical to the circuit of a conventional mixer except for the introduction of voltage-controlled gain elements in each input channel and in the master mixed signal channel. Since the range of gain shift necessary is not great (around 20 dB maximum) these may be simple photoconductive elements which contribute no measurable noise or distortion.

Outside the audio signal path an envelope detector circuit produces a DC control voltage representing the audio level in the chanel, which is anaogous to the sound level at the microphone. An identical envelope detector monitors the noise microphone channel. A comparator associated with each input channel observes the ratio of signal to noise in that channel and sends the "go" command to the attenuator-gate whenever it is satisfactory. The acoustic S/N ratio at which each channel turns on its determined by the setting of the threshold control which biases the comparator. The optimum threshold setting is that which causes the channel to turn on just below the input level which would make any perceptible contribution to the resulting mix. Thus the turning-on of the gate is masked.

makes the "all mikes off" total system gain identical with the "all mikes on" total gain. This at first seems to be a paradox, but it actually is a key to smooth operation. Ideally, the amount of attenuation of the off channels should vary depending on how many channels are on, but it was found that a fixed amount of attenuation could produce very satisfactory performance. The amount of attenuation was set to be the power ratio of the gain of one mike to the gain of six mikes (the prototype had six inputs) plus 3 dB. The table shows the results of the interaction of the individual channel attenuators with the master gain adjustor.

| CONDITION | input gains dB | | | | | master gain 6 adj. dB | total system gain dB |
|---|---|---|---|---|---|---|---|
| | 1 | 2 | 3 | 4 | 5 | | |
| all off | −11 | −11 | −11 | −11 | −11 | −11 +3 | 0 |
| one mike in use | 0 | −11 | −11 | −11 | −11 | −11 0 | +0.4 |
| 2 mikes in use | 0 | 0 | −11 | −11 | −11 | −11 −3 | +0.5 |
| all mikes in use | 0 | 0 | 0 | 0 | 0 | 0 −8 | 0 |

Thinking of this in terms of mike working distance, if the threshold is set to turn the mike on from a source which is just a bit too far away to get any useful gain, then the channel will always be on when the source is audible, and conversely switching will not be audible.

When the ambient sound level is low, the gates become extremely sensitive, and will open for a whisper several feet from the mike. One can imagine a "balloon" os sensitivity extending out from the mike to the threshold distance where the noise level equals the source. When the ambience is high level, such as the case with vocal mikes in front of an electric band, the threshold becomes correspondingly high and the balloon contacts to less than an inch. This also corresponds to the useful working distance of the mike under those conditions.

It is necessary for the envelope detector circuits to be able to handle a wide dynamic range, even in speech systems. The sound levels which may appear at a microphone range from 30 dB in a quiet room to over 120 dB from a close-talking loud voice. In practice an 80 dB range has been adequate.

The master gain adjustor circuit monitors the number of open microphones by summing the control voltages of all the inputs, and using this voltage to actuate an attenuator in the master channel which is made to have the proper curve for 3 dB gain reduction whenever the NOM is doubled.

The present improvement is the result of a combination of improvements in the original invention. Some details of this development process will shed more light on the principles of both the original invention and the improvement.

Channel attenuators began by being very fast on-off gates and subsequently went through many changes of dynamic and attenuation characteristics. The optimum attenuation when a channel is in the off condition is just enough to keep the channel out of trouble. Rather than turning the input channel on and off, the gates need to shift it between two levels, "hot" and "safe." This is the technique that an experienced human mixer uses. Mikes which are standing by are kept turned down but not off, so that they don't have so far to go when they come up. It turns out that the optimum amount of attenuation for the input channel gates is that which, combined with the effect of the master gain adjustor, Note that the total gain of the system remained substantially constant under all conditions of use.

There are two advantages to configuring the system this way. First, the threshold of feedback remains the same no matter how many mikes are in use. This means the system automatically mixes for maximum acoustic gain under varying conditions of use. Second, the pickup of ambient noise by the system remains substantially constant, which is very important in recording and brodcasting. "Pumping" or "breathing" of background noise is the most-often heard flaw in automatic audio gain control systems. The level of ambient noise picked up by the system will alway be about the same as is picked up by one mike at normal gain, no matter how many mikes are actually open. This system, then, not only approaches "one mike" gain in multi-mike installations, it also approximates one-mike noise pickup.

Since the gain shifts in the system are quite small, they are masked by the much larger shifts in signal level which stimulate them. For example, the largest master gain shift is 3 dB, the difference between one and two mikes operating. When an instrument or voice on one mike is joined by a second on another, perception of the 3 dB drop in level which is imposed upon the first signal is masked by the perception of the entrance of the second sound. These shifts are really small compared to the large amounts of limiting and compression used in popular music recording. They are not perceptible in test recordings made from the mixer prototype during live musical performances.

In speech systems, it was discovered that a much more accurate reference signal could be obtained from the sum of all the inputs (before the attenuators) than from a separate reference microphone. What better way could there be to sample the sound level in the area of the microphones than with the microphones themselves? The multi-mike sample is much more accurate due to the averaging of standing waves.

The pursuit of errors in system operation always led to significant improvements in performance One error which led to a very significant step was the "sailing" problem. The input channel attenuator at the time had a moderately fast attack, 20 milliseconds or so, fast enough to catch attack transients of consonants but not so fast as to cause a transient of its own when interrupting low frequency sounds. The decay was slow, 400 ms or so. The error occurred when a singer sang the word sailing softly while instruments sustained a note. It would come out "tailing" because the input gate would not trigger until the level of the *s* sound had come up out of the ambient level, and by that time it was too late. There was no way to deal with this in a simple "go-no go" gating system. Two alternatives were considered: going to a multi-band (like Dolby) system which would improve masking, or making the attack of the signal control the speed of the attack of the gate. The latter was chosen.

The comparator and gate circuits were reconfigured to have a 10 dB wide "expansion window" instead of a point threshold which simply caused the gate to trigger on. When the input signal rises above the lower threshold of the window, instead of triggering up to high gain it is expanded with a 2/1 slope until it reaches its normal on gain, and then acts linearly as long as the input stays above this upper threshold. In this way the rate of gain increase is controlled by the rate of signal increase, and the same gain shifts can be accomplished as before, but much more smoothly and without the sailing error.

This system can be packaged as a conventional mixer or included as a feature of a console. A threshold control is required for each input, with an indicator showing the condition of the gate.

During tests and demonstrations of the system described above, an apparent malfunction was observed. Under certain conditions, when two microphones were actuated at the same time, each of the two channels would come up only to 3 dB below normal gain, and the master gain adjustor, which was being monitored with a meter, would stay at 0. The total gain would be correct, but the 2 dB attenuation that was supposed to be coming from the master channel was coming from the individual channels instead. This anomaly was reproduced in the lab and it was found that it occurred in the mode of operation where the sum of the inputs was furnishing the reference, and the thresholds were set so that an input to one channel only would cause that channel's gain to ride just at the top of the 2/1 expansion window.

Analysis of the system voltages when the thresholds were set at that point revealed that a new control function had been discovered, making possible a much simpler system than had ever been imagined.

SUMMARY OF THE INVENTION

The elements are the same as those described for the system above, but instead of the NOM master gain shift taking place in the output channel, all necessary adjustments are made on the input channels. The amount of attenuation in each channel is no longer fixed, but varies depending on the signal ratios in the system. The operation of this system can be described by a crude but intuitively useful expression: each input shall be attenuated by the same number of dB that the level in that input (before attenuator) is below the level of the sum of all inputs (before attenuators). In a somwhat more precise expression:

$$\text{relative gain of each input into summing network} = \frac{\text{level of input}}{\text{level of sum of all inputs}}$$

where the word "level" implies some integration of the instantaneous signals, such as rms.

It is not immediately apparent how this function will give the same performance as the first system in many applications. A series of examples of the actions of the attenuators in response to various patterns of stimuli is shown below. The system acts in response to the ratios between the input signals, and the absolute level of the inputs does not affect the gain situation at all. This remains true as long as the signal levels remain within the operating range of the envelope detectors. The highest level input in each example is called 0 dB; this could be any level, of course, so the same example serves for both the case in which ambient noise impinges equally on all mikes and the case in which equal signals are presented to all mikes.

A. Equal level from four microphones ambient noise condition or four equal stumili.

| input | level dB | attenuator dB | result level dB |
|---|---|---|---|
| 1. | 0 | −6 | −6 |
| 2. | 0 | −6 | −6 |
| 3. | 0 | −6 | −6 |
| 4. | 0 | −6 | −6 |
| reference | +6 | total gain 0 | mix level 0 |

B. One mike 20 dB higher than others - normal use condition.

| input | level dB | attenuator dB | result level dB |
|---|---|---|---|
| 1. | 0 | 0 | 0 |
| 2. | −20 | −20 | −40 |
| 3. | −20 | −20 | −40 |
| 4. | −20 | −20 | −40 |
| reference | 0 | total gain 0 | mix level 0 |

C. Two mikes 20 dB higher than others - two talkers or one talker between two mikes.

| input | level dB | attenuator dB | result Level dB |
|---|---|---|---|
| 1. | 0 | −3 | −3 |
| 2. | 0 | −3 | −3 |
| 3. | −20 | −23 | −43 |
| 4. | −20 | −23 | −43 |
| reference | +3 | total gain 0 | mix level 0 |

D. Spread of levels.

| input | level dB | attenuator dB | result level dB |
|---|---|---|---|
| 1. | 0 | −1.5 | −1.5 |
| 2. | −5 | −6.5 | −11.5 |
| 3. | −10 | −11.5 | −21.5 |
| 4. | −15 | −16.5 | −31.5 |
| reference | +1.5 | total gain 0 | mix level −1.0 |

The apparent constancy of the mix level in these examples should not be interpreted as the result of limiting or AGC action. The "0" is relative to the 0 arbitrary signal level of the input, and may assume any value instantaneously. The dynamics of the signal throughput from the active mike to the output are completely preserved.

The action of this automatic system does fulfill the objective of simulating manual mixing for maximum gain. When one mike is in use, system gain is concentrated at the mike and others are attenuated. When two or more mikes are in use, gain is divided among them proportionally so that the total system gain remains constant. In the "at rest" condition, all mikes return to a balance which is the maximum safe gain for that number of open mikes. Momentary level differences between input channels are expanded by a factor of two (in dB).

The present systm is indistinguishable insofar as its utility in speach reinforcement is concerned from the system of U.S. Pat. No. 3,814,856. The present system offers two significant advantages. First, adjustment of thresholds is unnecessary. It is very valuable from a human engineering standpoint to not have any control requiring the learing of a new function. The people who adjust sound systems after the installer has left are usually unskilled, and the fewer knobs the better. If indicators are provided showing the action of the channel attenuators (LED's typically), they can aid an unskilled person trying to adjust the level of a mike. The LED associated with the active channel will illuminate, guiding the hand to the proper knob and eliminating the need to either memorize, read, or figure out which knob corresponds to which mike.

The other advantage of the present system is its extendability. The three-system buses can link together any number of input channels, and channels can be added or deleted at any time without affecting operation or requiring any adjustment. Microphones can be switched on and off or even unplugged freely, for whenever a channel has insignificant audio level, it is attenuated.

Accordingly, a principal object of the present invention is a method and apparatus for automatically controlling multi-microphone mixing systems so that unused microphones are kept attenuated and maximum gain is available from any microphone being used.

Another object of the invention is to provide a means by which multiple microphones can be utilized without incurring the disadvantages of increased ambient noise pickup and reduced gain.

A further objct of the invention is to provide means by which sound reinforcement systems having any number of microphones can be operated automatically with maximum gain available at each microphone.

A still further object of the invention is to provide a means for reducing the ambient noise and reverberation pickup of a sound mixing system by automatically and silently raising and lowering the gain of each microphone in response to the sound levels existing at the microphones.

A still further object of the invention is to provide a means by which the gain of a multiple-microphone reinforcement system can be maximized automatically in accordance with the number of active microphones.

Another object of the invention is to provide the above-mentioned features in a device which is easy to install and operate, requires no special wiring, usable with all other standard sound system components, and requires no special adjustments.

DESCRIPTION OF THE DRAWINGS

The above and other objects, features and advantages of the invention will be apparent from the detailed description of the accompanying drawings in which.

DETAILED DESCRIPTION

Figure 1:
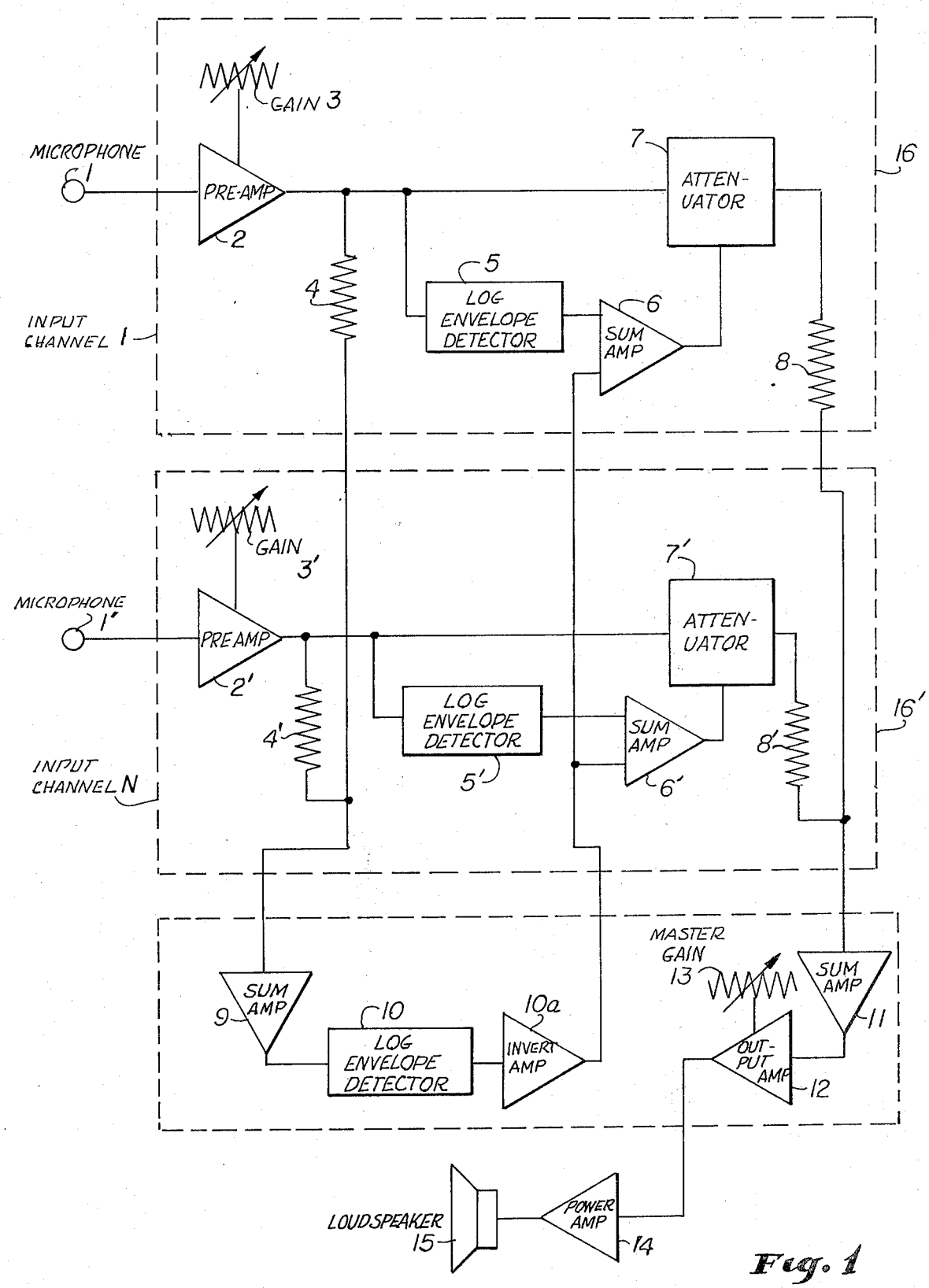
FIG. 1 is a block diagram of a preferred embodiment of the present invention.

Referring to FIG. 1, there is provided a plurality of input signal sources, such as microphones 1 and 1' coupled, respectively, to a pair of microphone preamplifiers 2 and 2'. Each of the preamplifiers 2 and 2' are provided, respectively, with a microphone preamplifier gain control 3 and 3' which typically comprises a variable resistor in the feedback loop of the amplifier. The controls 3 and 3' are typically front panel controls by which the desired sensitivity of each microphone is set.

Coupled, respectively, to the output of preamplifiers 2 and 2' are a pair of summing resistors 4 and 4', a pair of envelope detectors 5 and 5', and a pair of attenuators 7 and 7'. Coupled, respectively, to the output of envelope detectors 7 and 7' are summing resistors 8 and 8'.

Components 2 through 8 and 2' through 8', respectively, comprise input channels 16 and 16'', which may be repeated as many times as there are inputs in the system.

The input of pre-mix summing amplifier 9 is coupled in common to summing resistors 4 and 4'. The output of amplifier 9 is coupled to envelope detector 10, which is identical to 5 and 5', and the output of 10 is coupled to the input of inverting buffer amplifier 10a. The output of amplifier 10a is coupled in common to a second input of comparing amplifiers 6 and 6'. The outputs of amplifiers 6 and 6' are respectively coupled to the control inputs of attenuators 7 and 7'.

The outputs of attenuators 7 and 7' are in turn coupled by means of resistors 8 and 8' to an output signal channel comprising a summing amplifier 11, an output amplifier 12 having an output amplifier gain control 13 similar to controls 3 and 3', a system power amplifier 14 and loudspeaker 15. The above circuitry common to all input channels 16 and 16' is designated for convenience as 17.

In operation, sound waves impinging upon microphone 1 generate electrical currents which are amplified by microphone preamplifier 2. A portion of the output of preamplifier 2 is summed by amplifer 9 with corresponding portions of the outputs of other channels via resistor 4. Envelope detector 10 converts the output of amplifier 9 into a DC control voltage proportional to the magnitude of the signal at the output of amplifier 9. Inverting amplifier 10a reverses the polarity of the output of envelope detector 10 and buffers it against the effect of the load of the inputs of amplifiers 6, 6', etc. Another portion of the output of amplifier 2 is fed to envelope detector 5, which is identical to envelope detector 10. Comparing amplifier 6 furnishes a control voltage to attenuator 7 which is proportional to the sum of its two inputs plus a fixed DC offset. Attenuator 7 also receives a portion of the output of preamplifier 2, and transmits a fraction of that current through to summing resistor 8, the magnitude of the current being proportional to the control voltage from amplifier 6. Summing amplifier 11 combines the signals from resistors 8, 8', etc. Output amplifier 12 provides the desired output voltage and impedance for driving loads external to the mixing system. Typically this will comprise a power amplifier 14 and loudspeaker 15. The circuitry 16 is repeated at 16' and as many times as necessary to accommodate all system microphones.

The signal level to control voltage conversion characteristic of envelope detector 5 and the control voltage to signal attenuation characteristic of attenuator 7 are made to be complementary. The gain of comparing amplifier 6 is made so that the sum of its inputs, which is analogous to the ratio of the output of amplifier 2 to the output of amplifier 9, produces a control voltage causing attenuator 7 to reduce the audio signal by the same ratio. A DC offset in the output of amplifier 6 is supplied so that when the control voltges at its inputs are equal and opposite, its output is at a DC level which produces no attenuation from attenuator 7.

The effect of the combination of these circuit actions is to attenuate each input channel by the same ratio that the level in that channel bears to the level of the sum of all inputs. When the level at one microphone is much higher than the levels at the other microphones, the envelope of that channel is substantially at the same level as the envelope of the sum of the inputs. Under this condition the attenuation applied to the active channel will be small, and the other channels will be attenuated a large amount. If the sound levels at two microphones are similar and much higher than the levels at the other microphones, the two active channels will be each attenuated to three decibels below the gain to which either one alone would be attenuated if alone. When the sound levels at all the microphones are substantially the same, as in the ambient noise condition, all channels will be attenuated by ten times the logarithm$_{10}$ of the number of microphones, in decibels. Thus the system at all times satisfies the requirement that the total acoustic gain of the system remain constant, and feedback is prevented under all conditions of automatic operation.

Figure 2:
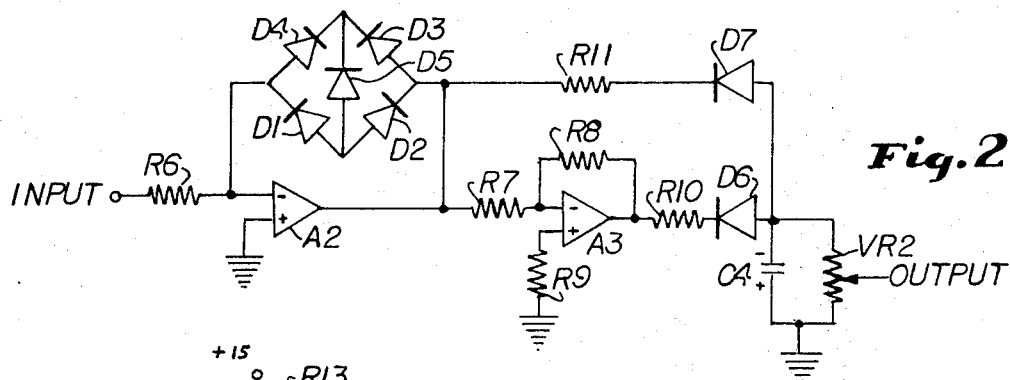
FIG. 2 is a schematic of the envelope detection circuits of FIG. 1.

Referring to FIG. 2, there is illustrated an envelope detector which may be used in the circuits 5, 5' and 10 of FIG. 1. Typical of the components which comprise the circuit of FIG. 2 are the following:

| | |
|---|---|
| R6 | 1K ohm |
| R7 | 10K ohm |
| R8 | 10K ohm |
| R9 | 4.7K ohm |
| R10 | 33 ohm |
| R11 | 33 ohm |
| A2 | operational amplifier |
| A3 | operational amplifier |
| D1-D7 | silicon diode |
| D5 | Zener diode 5.1 V |
| C4 | 100 mF |
| VR2 | 10K ohm |

In operation, an audio signal from the microphone preamplifier is applied to the input terminal R6. A2, R6, and D1 through D5 comprise an AC logarithmic amplifier. The output of A2 is rectified by D7 and averaged by C4. Positive-going outputs of A2 are rectified at D6 after inversion by inverting amplifier A3 in combination with R7 through R9. Adjustment of VR2 allows the obtaining of the precise desired output slope.

Figure 3:
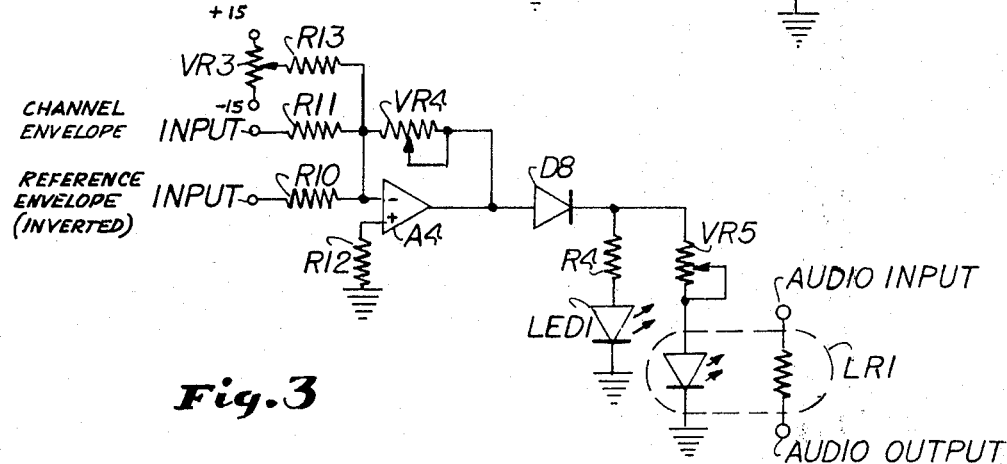
FIG. 3 is a schematic of the comparing amplifier and attenuator circuits of FIG. 1.

Referring to FIG. 3, there is illustrated a comparing amplifier and an attenuator which may be used in the circuits 6 and 6' and 7 and 7' of FIG. 1. Typical of the components which comprise the circuit of FIG. 3 are the following:

| | |
|---|---|
| R10, 11 | 10K ohms |
| R12 | 4.7K ohms |
| R13 | 220K ohms |
| R14 | 560 ohms |
| A4 | operational amplifier |
| VR3 | 100K ohms |
| VR4 | 2M ohms |
| VR5 | 5K ohms |
| D8 | silicon diode |
| LED 1 | panel indicator |
| LR1 | LED-LDR, Vactec VTL-2C3 typ. |

In practice A4 and the associated input and feedback network R10 through R13, VR3, VR4 comprise a DC summing amplifier. Resistors R10 and R11 sum the reference envelope from inverter 10A and the envelope of the associated input. The reference envelope has been inverted by inverter 10A so that these signals are of opposite polarity, and their sum is 0 when they are equal. VR3 and R13 provide an offset voltage which is adjusted to produce the desired output level when the inputs total 0. VR4 is used to set the gain of A4. D8 protects the following diodes from reverse current. R14 limits current to LED 1, an optional panel indicator of the automatic gain adjusting action. VR5 limits current to the LED section of LED-LDR LR1. The audio signal is passed through the light-dependent-resistor section of LR1, and is attenuated depending on the amount of current flowing through the LED.

In normal operation the output of A4 is constantly varying between a maximum and zero. The maximum output occurs when the input control voltages are equal and opposite and the offset from VR3 drives the input. This maximum output causes the maximum current to flow in the LED section of LR1, and consequently minimum resistance in the resistor section of LR1 and maximum audio gain. When the control voltage for the channel is less than the reference control voltage, the reference control voltage will drive the output of A4 in the negative direction, reducing the output voltage. The reduced voltage will result in reduced illumination of the LED's, and increased resistance in LR1. The increased resistance will attenuate the audio signal.

The system expressed by FIG. 1 is doubtlessly the preferred embodiment, using rms detection for the envelopes. However, more crude approximations of this performance, some of which are not so easy to express in mathematics, may be employed. For example, the most obvious of these is the use of a simple half-wave rectified signal for the envelope, either peak or average-filtered. Another possibility is the use of raw, unaveraged signals to perform the gain computation. This method generates gross distortion unacceptable in high fidelity systems, but may be desirable in subminiature or high-reliability applications where the elimination of capacitors is more important than fidelity.

Moreover, it is recognized that the signal control system of the present invention, while described herein specifically with respect to a sound reinforcement system, has utility in other multi-channel applications, such as, for example, multichannel video systems and other analog systems generally.

Still other modifications and applications of the circuits described which fall within the spirit and scope of the present invention will undoubtedly occur to those skilled in the art.

Accordingly, the description herein is provided only for purposes of illustration and is not intended to limit the invention to that which is described, but rather the scope of the invention is intended to be defined by reference to the claims hereinafter provided.

What is claimed is:

1. In a signal control system including a plurality of input signal channels for receiving a plurality of input signals, comprising a plurality of controlling means each receiving one of said input signals and each comprising means for multiplying said one input signal by the quotient of the average amplitude of said input signal divided by the average amplitude of the sum of all the input signals of all of said input channels and transmitting means for transmitting the output of each of said controlling means.

2. A system according to claim 1 which further comprises summing means summing the outputs of all of said transmitting means.

3. A system according to claim 1 which further comprises:
   a microphone for each of said input channels;
   a microphone pre-amplifying means for each of said microphones;
   first summing means responsive to the outputs of all of said microphone peamplifying means for generating a signal proportional to the sum of all said input signals;
   second summing means for summing the outputs of each of said controlling means;
   power amplifying means for the output of said second summing means;
   loudspeaking means responsive to said power amplifying means for providing sound reinforcement or communication from said microphones.

4. A signal control system comprising a plurality of input signal channels each receiving an input signal;
   input summing means for summing the inputs of each of said input signal channels;
   a first envelope detector for rectifying and averaging the output of said input summing means, said first envelope detector generating a signal proportional to the average amplitude of the sum of the input signals of all of said input signal channels;
   and for each of said input signal channels:
   a second envelope detector for rectifying and averaging the input of said input channel, said second envelope detector generator a signal proportional to the average amplitude of said input signal of said input signal channel;
   divider means dividing the output of said second envelope detector by the output of said first envelope detector;
   product means multiplying the input signal of said input signal channel by the output of said divider means;
   and transmitting means for transmitting the output of said product means.

5. A system according to claim 4 which further comprises output summing means for summing the outputs of all of said transmitting means.

6. A system according to claim 5 which further comprises:
   a microphone for each of said input channels;
   microphone preamplifying means for each of said microphones;
   power amplifying means for the output of said output summing means;
   loudspeaking means responsive to said power amplifying means for providing sound reinforcement or communication from said microphones.

7. A system according to claim 4 wherein:
   said first envelope detector and said second envelope detector each comprises a logarithmic amplifying means for generaing an output signal which is a logarithmic function of its input signal;
   said divider means each comprises difference means;
   and said product means has an anti-logarithmic funcftion with respect to the input signal derived from said divider means.

8. A system according to claim 4 wherein said product means comprises a voltage-controlled amplifier.

9. A system according to claim 8 wherein said voltage-controlled amplifier includes a light-emitting diode optically coupled to a light-dependent resistor.

* * * * *